(12) United States Patent
Sridhar et al.

(10) Patent No.: US 10,115,591 B2
(45) Date of Patent: Oct. 30, 2018

(54) SELECTIVE SIARC REMOVAL

(71) Applicant: Tokyo Electron Limited, Minato-ku, Tokyo (JP)

(72) Inventors: Shyam Sridhar, Albany, NY (US); Li Wang, Portland, OR (US); Andrew Nolan, Albany, NY (US); Hiroto Ohtake, Hillsboro, OR (US); Sergey Voronin, Delmar, NY (US); Alok Ranjan, Tomiya (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/440,604

(22) Filed: Feb. 23, 2017

(65) Prior Publication Data

US 2018/0197730 A1 Jul. 12, 2018

Related U.S. Application Data

(60) Provisional application No. 62/445,042, filed on Jan. 11, 2017, provisional application No. 62/301,386, filed on Feb. 29, 2016.

(51) Int. Cl.
*H01L 21/461* (2006.01)
*H01L 21/027* (2006.01)
(Continued)

(52) U.S. Cl.
CPC ...... *H01L 21/0274* (2013.01); *H01L 21/0234* (2013.01); *H01L 21/0272* (2013.01);
(Continued)

(58) Field of Classification Search
CPC ........... H01L 21/02315; H01L 21/0234; H01L 21/02126; H01L 21/0214
(Continued)

(56) References Cited

U.S. PATENT DOCUMENTS

| 6,720,251 | B1 | 4/2004 | van Schravendijk et al. |
| 2004/0171260 | A1* | 9/2004 | Choi ............... H01L 21/0276 438/689 |

(Continued)

FOREIGN PATENT DOCUMENTS

| CN | 103370286 A | 10/2013 |
| TW | 201203354 A | 1/2012 |

(Continued)

OTHER PUBLICATIONS

International Searching Authority, Search Report and Written Opinion of corresponding International Application No. PCT/US2017/019116 dated Jun. 5, 2017, 13 pp.

(Continued)

*Primary Examiner* — Binh X Tran
(74) *Attorney, Agent, or Firm* — Wood Herron & Evans LLP

(57) ABSTRACT

Methods and systems for selective silicon anti-reflective coating (SiARC) removal are described. An embodiment of a method includes providing a substrate in a process chamber, the substrate comprising: a resist layer, a SiARC layer, a pattern transfer layer, and an underlying layer. Such a method may also include performing a pattern transfer process configured to remove the resist layer and create a structure on the substrate, the structure comprising portions of the SiARC layer and the pattern transfer layer. The method may additionally include performing a modification process on the SiARC layer of the structure, the modification converting the SiARC layer into a porous SiARC layer. Further, the method may include performing a removal process of the porous SiARC layer of the structure, wherein the modification and removal processes of the SiARC layer are configured to meet target integration objectives.

19 Claims, 15 Drawing Sheets

(51) Int. Cl.
*H01L 21/3065* (2006.01)
*H01L 21/306* (2006.01)
*H01L 21/033* (2006.01)
*H01L 21/02* (2006.01)

(52) U.S. Cl.
CPC .. *H01L 21/02126* (2013.01); *H01L 21/02315* (2013.01); *H01L 21/0331* (2013.01); *H01L 21/3065* (2013.01); *H01L 21/30604* (2013.01)

(58) Field of Classification Search
USPC ................. 438/710, 718, 719, 738, 757
See application file for complete search history.

(56) References Cited

U.S. PATENT DOCUMENTS

| | | | |
|---|---|---|---|
| 2006/0102208 A1 | 5/2006 | Jacobson et al. | |
| 2008/0268655 A1* | 10/2008 | Gale | H01L 21/28123 438/779 |
| 2010/0216310 A1* | 8/2010 | Metz | H01L 21/0276 438/694 |
| 2011/0076623 A1 | 3/2011 | Fitrianto | |
| 2011/0101507 A1 | 5/2011 | Yusuff et al. | |
| 2011/0306215 A1* | 12/2011 | Ding | H01L 21/02057 438/720 |
| 2012/0129331 A1* | 5/2012 | Choi | H01L 21/28088 438/592 |
| 2014/0187047 A1 | 7/2014 | Tagami et al. | |
| 2016/0372334 A1* | 12/2016 | Mignot | H01L 21/31116 |

FOREIGN PATENT DOCUMENTS

| | | |
|---|---|---|
| TW | 201407293 A | 2/2014 |
| WO | 2014149286 A1 | 9/2014 |

OTHER PUBLICATIONS

Taiwan Patent Office, Office Action issued in related TW Application No. 106106303 dated Jun. 5, 2018, 12 pp. Including English Translation.

* cited by examiner

SELECTIVE SIARC REMOVAL

BACKGROUND OF THE INVENTION

Field of Invention

The present invention relates to a system and method for substrate processing, and more particularly to a system and method of selectively removing the silicon anti-reflective coating (SiARC) without damaging the underlying film.

Description of Related Art

Lithographic processes using radiation sensitive material (also referred to herein as "resist") are widely used in the manufacture of semiconductor devices and other patterned structures. In track photolithographic processing used in the fabrication of semiconductor devices, the following types of processes may be performed in sequence: photoresist coating that coats a photoresist solution on a semiconductor wafer to form a photoresist film, heat processing to cure the coated photoresist film, exposure processing to expose a predetermined pattern on the photoresist film, heat processing to promote a chemical reaction within the photoresist film after exposure, developing processing to develop the exposed photoresist film and form a photoresist pattern, etching a fine pattern in an underlying layer or substrate using the photoresist pattern, etc.

In the photolithographic processing, an organic or inorganic anti-reflection coating (ARC) layer may be deposited on a layer to be etched before forming the photoresist pattern. The ARC layer may be used to reduce reflection of light from the layer to be etched while forming the photoresist pattern on the ARC layer by an exposure process. For example, the ARC layer may prevent a standing wave effect caused by interference between incident light toward a photoresist film and reflected light from the layer to be etched.

Advanced organic and inorganic ARC layers have been developed for increased density of features that improve the cost per function ratio of the microelectronic device being manufactured. As the drive toward smaller and smaller features continues, several new problems in the manufacture of these very small features are becoming visible. Silicon-containing ARC (SiARC) layers are promising candidates for hard masks because Si-content of SiARC layers may be tuned to provide high etch selectivity to photoresist. Unfortunately, removal of many new materials used in advanced ARC layers, for example SiARC layers, can be problematic, and new processing methods for removing these materials and other layers are needed for microelectronic device production.

SUMMARY OF THE INVENTION

Methods and systems for selective SiARC removal are described. An embodiment of a method includes providing a substrate in a process chamber, the substrate comprising: a resist layer, a SiARC layer, a pattern transfer layer, and an underlying layer. Such a method may also include performing a pattern transfer process configured to remove the resist layer and create a structure on the substrate, the structure comprising portions of the SiARC layer and the pattern transfer layer. The method may additionally include performing a modification process on the SiARC layer of the structure, the modification converting the SiARC layer into a porous SiARC layer. Further, the method may include performing a removal process of the porous SiARC layer of the structure, wherein the modification and removal processes of the SiARC layer are configured to meet target integration objectives.

Another embodiment of a method may include providing a substrate in a process chamber, the substrate comprising: a resist layer, a silicon-based layer, a pattern transfer layer, and an underlying layer. The method may also include performing a pattern transfer process configured to remove the resist layer and create a structure on the substrate, the structure comprising portions of the silicon-based layer and the pattern transfer layer. Additionally, the method may include performing a modification process on the silicon-based layer of the structure, the modification configured to change chemical and/or physical properties of the silicon-based layer to enable high etch selectivity of the silicon-based layer compared to the pattern transfer layer and/or the underlying layer. Also, the method may include performing a removal process of the silicon-based layer of the structure, wherein the modification and removal processes of the silicon-based layer are configured to meet target integration objectives.

Another embodiment of a method includes providing a substrate in a process chamber. In an embodiment, the substrate comprises a resist layer, a silicon oxynitride or a SiARC layer, an optical planarization layer (OPL) or organic layer and a target patterning layer. Additionally, the method may include performing a SiARC open process, the SiARC open process creating a structure on the substrate with a critical dimension (CD). The method may also include performing a nitridation process for the SiARC layer, the nitridation creating a nitrogen-rich SiARC layer. In an alternative embodiment, an oxidation process may be used to modify the SiARC layer, thereby creating a porous SiARC layer. Additionally, the method may include performing a selective etch process of the modified SiARC layer. In such embodiments, the selective etch process exhibits high sensitivity to device level structures in the substrate and the integration process is configured to meet target integration objectives.

Another embodiment of a method includes providing a substrate in a process chamber, the substrate comprising: a resist layer, a silicon-based layer, a pattern transfer layer, and an underlying layer. Such a method may further include performing a pattern transfer process configured to remove the resist layer and create a structure on the substrate, the structure comprising portions of the silicon-based layer and the pattern transfer layer. Additionally, the method may include performing a modification process on the silicon-based layer of the structure, the modification configured to change chemical and/or physical properties of the silicon-based layer to enable high etch selectivity of the silicon-based layer compared to the pattern transfer layer and/or the underlying layer. The method may also include performing a removal process of the silicon-based layer of the structure, wherein the modification and removal processes of the silicon-based layer are configured to meet target integration objectives.

In an embodiment, the silicon-based layer is a silicon anti-reflective coating (SiARC) and the pattern transfer layer comprises a carbon hard mask (CHM) layer, an organic dielectric layer (ODL), an amorphous silicon layer, and/or an oxide layer. In one embodiment, the modification process uses an oxygen, hydrogen, or nitrogen plasma. The removal process of the silicon-based layer may utilize a dry etch process step, a wet etch process step, a combination of a dry etch process step and a wet etch process step or a combination of a first dry etch process step and a second dry etch process step.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

Figure 1:
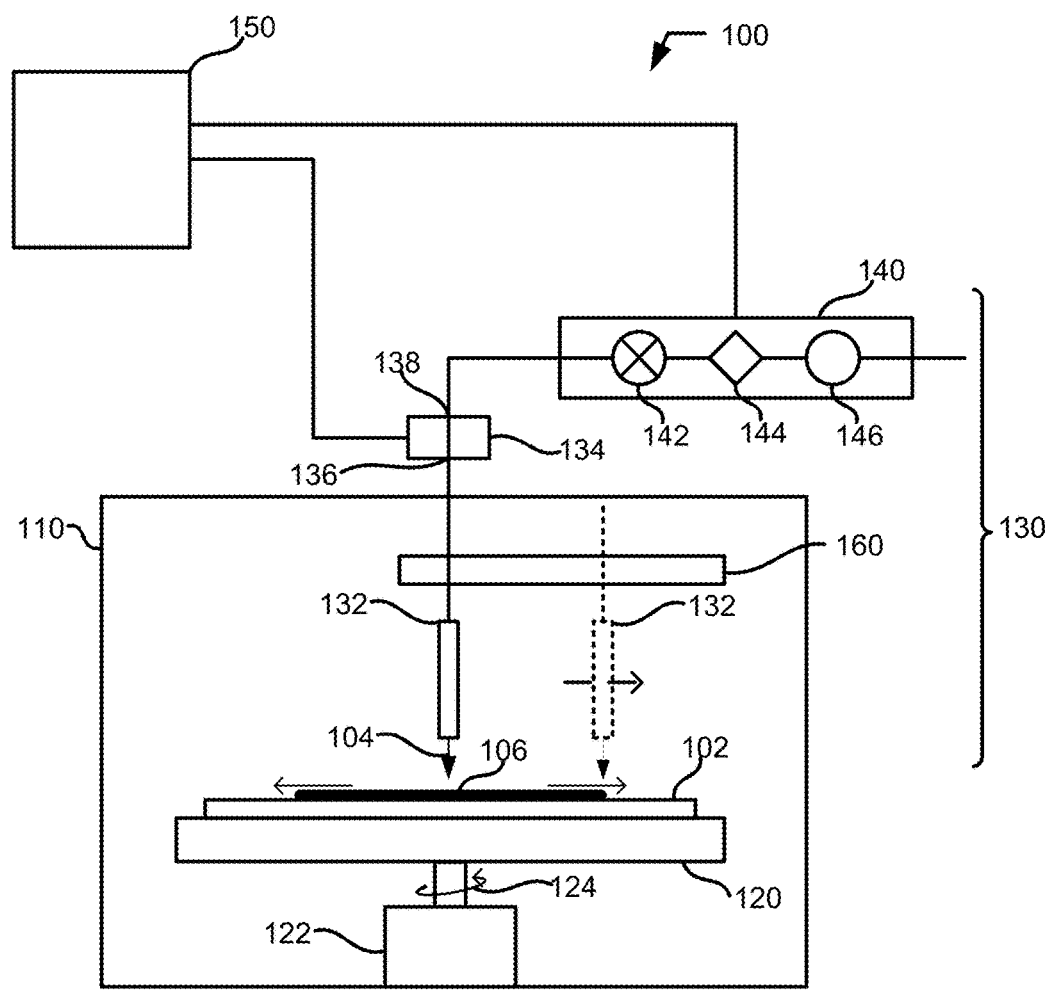
FIG. 1 illustrates an embodiment of a coating system configured for forming a trilayer photoresist stack on a substrate.

Numbered elements contained in the specification will make reference to figures in the list, even prior to being discussed and may also be referred to while discussing a later figure. For example, reference numerals depicted in FIG. 2 may be used in description of FIGS. 6A-7C, even if the reference numeral is not specifically shown in FIGS. 6A-7C.

DETAILED DESCRIPTION OF EMBODIMENTS OF THE INVENTION

Methods and systems for selective SiARC removal are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Methods and systems for selective SiARC removal are described. An embodiment of a method includes providing a substrate in a process chamber, the substrate comprising: a resist layer, a SiARC layer, a pattern transfer layer, and an underlying layer. Such a method may also include performing a pattern transfer process configured to remove the resist layer and create a structure on the substrate, the structure comprising portions of the SiARC layer and the pattern transfer layer. The method may additionally include performing a modification process on the SiARC layer of the structure, the modification converting the SiARC layer into a modified SiARC layer. Further, the method may include performing a removal process of the modified SiARC layer of the structure, wherein the modification and removal processes of the SiARC layer are configured to meet target integration objectives.

Another embodiment of a method may include providing a substrate in a process chamber, the substrate comprising: a resist layer, a silicon-based layer, a pattern transfer layer, and an underlying layer. The method may also include performing a pattern transfer process configured to remove the resist layer and create a structure on the substrate, the structure comprising portions of the silicon-based layer and the pattern transfer layer. Additionally, the method may include performing a modification process on the silicon-based layer of the structure, the modification configured to change chemical and/or physical properties of the silicon-based layer to enable high etch selectivity of the silicon-based layer compared to the pattern transfer layer and/or the underlying layer. Also, the method may include performing a removal process of the silicon-based layer of the structure, wherein the modification and removal processes of the silicon-based layer are configured to meet target integration objectives.

In an embodiment, the selective etch process is a dry etch process. The surface modification process may utilize an $H_2N_2$ plasma. In another embodiment, the dry etch process uses an $O_2$ plasma. In another embodiment, the selective etch process is a wet etch process. In such an embodiment, the wet etch utilizes diluted HF/HCl.

In one embodiment, implanting the nitrogen atoms in the SiARC is optimized according to energy and depth of implantation objective. Optimization of the nitridation process may result in less residue after the integration process.

In an embodiment, the method includes controlling one or more operating variables of the integration sequence in order to meet target integration objectives. In such an embodiment, the one or more operating variables include plasma density, $N_2$ feed gas flow, and etching time. The one or more operating variables may also include process pressure, process temperature, and bias power. In an embodiment, the plasma density is a function of source power. The target integration objectives may include percent removal of residue, extent of damage to the device-level structures on the substrate, and/or extent of damage to the OPL or organic layer.

In various embodiments, the process pressure is in a range from 5 mT to 300 mT and etching time is 5 to 600 seconds. The process temperature may be in a range from −10 degrees Celsius to +80 degrees Celsius, and the feed gas flow is in a range from 10 sccm to 2000 sccm for $N_2/H_2$. The source power may be in the range of 100 W to 3000 W and bias power is in a range of 100 W to 3000 W. The maximum ion energy may be in the range of 100 eV to 2000 eV. Although these ranges are provided as embodiments, one of ordinary skill will recognize alternative ranges which may be as useful or more useful, depending upon the materials and gas mixtures in use. In one embodiment, the oxygen oxynitride is SiONx wherein x is a number greater than zero.

In an embodiment, the one or more operating variables include fluence of implanted nitrogen ions; and wherein the fluence of the implanted nitrogen ions is a function of ion flux and length of implantation at a plasma sheath.

The depth of nitrogen ion penetration may be a function of ion energy and wherein the ion energy is a function of bias power and pressure in the process chamber. In an embodiment, selected two or more of the operating variables of the film layer or region removal process are controlled using a controller in order to meet layer or region removal process objectives.

Referring now to the drawings, like reference numerals designate identical or corresponding parts throughout the several views.

FIG. 1 illustrates a coating system 100 including a coating chamber 110, a substrate holder 120 coupled to the coating chamber 110 and configured to support substrate 102, and a solution nozzle assembly 130 configured to dispense a solution, such as a SiARC resist solution. Additionally, the coating system 100 includes a controller 150 coupled to the substrate holder 120 and the solution nozzle assembly 130, and configured to exchange data, information, and control signals with the substrate holder 120 and the solution nozzle assembly 130.

The substrate holder 120 is configured to rotate (or spin) substrate 102 during dispensing of solution 104 on the center 106 of the upper surface of substrate 102 from the solution nozzle assembly 130. A drive unit 122 coupled to the substrate holder 120 is configured to rotate the substrate holder 120. The drive unit 122 can, for example, permit setting the rotation rate, and the rate of acceleration of the substrate holder rotation 124.

The solution nozzle assembly 130 includes a single nozzle 132 positioned substantially near the center of substrate 102, and above an upper surface thereof. The nozzle 132 is configured to dispense a solution, such as a trilayer photoresist film solution including, for example an Organic Planarization Layer (OPL), a Silicon-containing Anti-Reflective Coating (SiARC), and a photosensitive patternable photoresist layer, on an upper surface of substrate 102 in a direction substantially perpendicular to the upper surface of substrate 102. An example of a process for depositing a trilayer photoresist structure is illustrated in FIGS. 2A-2D. The nozzle 132 is coupled to an outlet end 136 of a control valve 134. An inlet end 138 of control valve 134 is coupled to a solution supply system 140. The control valve 134 can be configured to regulate dispensing the solution on substrate 102. When open, the solution is dispensed upon the substrate 102. When closed, the solution is not dispensed upon the substrate 102. The solution supply system 140 can include at least one of a fluid supply valve 142, a filter 144, and a flow measurement/control device 146. Additionally, nozzle 132 is configured to translate in a radial direction from the center of substrate 102 to the peripheral edge of substrate 102 using translation drive assembly 160, while dispensing solution as shown by the ghost image of nozzle 132.

Additionally, controller 150 includes a microprocessor, memory, and a digital I/O port (potentially including D/A and/or ND converters) capable of generating control voltages sufficient to communicate and activate inputs to the drive unit 122 of substrate holder 120, the solution nozzle assembly 130 (e.g., first control valve 134), solution supply system 140, and translation drive system 160 as well as monitor outputs from these systems. A program stored in the memory is utilized to interact with these systems according to a stored process recipe.

Controller 150 may be locally located relative to coating system 100, or it may be remotely located relative to the coating system 100 via an internet or intranet. Thus, controller 150 can exchange data with coating system 100 using at least one of a direct connection, an intranet, and the internet. Controller 150 may be coupled to an intranet at a customer site (i.e., a device maker, etc.), or coupled to an intranet at a vendor site (i.e., an equipment manufacturer). Furthermore, another computer (i.e., controller, server, etc.) can access controller 150 to exchange data via at least one of a direct connection, an intranet, and the internet.

Figure 2A:
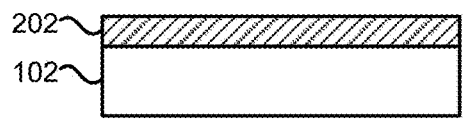
FIG. 2A illustrates an embodiment of a process for forming a trilayer photoresist stack on a substrate.

FIGS. 2A-2D illustrate a process for forming a trilayer resist structure on a substrate 102. In general, the substrate 102 will be provided with an intermediary layer 202 in which certain features will be formed as shown in FIG. 2A. For example, the intermediary layer 202 may include dielectric materials, such as an oxide layer (e.g., $SiO_2$), a nitride layer (e.g., $Si_3N_4$), or the like. In some embodiments, the intermediary layer 202 is formed on the surface of the silicon wafer by baking the wafer in a furnace or heating chamber. In some embodiments, vapors are introduced into the chamber to form the desired intermediary layer 202.

Figure 2B:
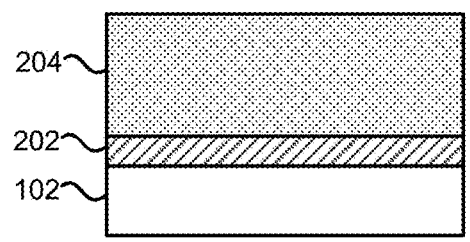
FIG. 2B illustrates an embodiment of a process for forming a trilayer photoresist stack on a substrate.
Figure 2C:
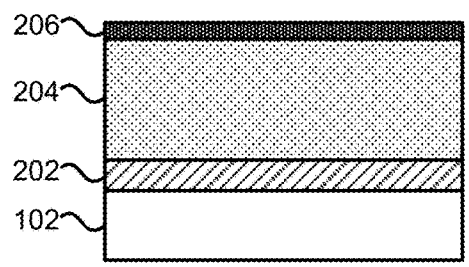
FIG. 2C illustrates an embodiment of a process for forming a trilayer photoresist stack on a substrate.
Figure 2D:
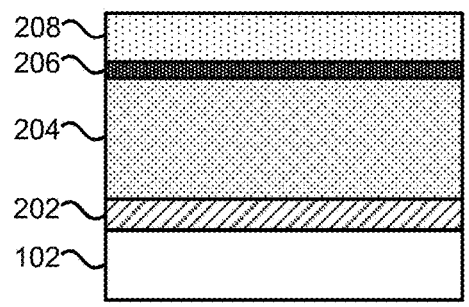
FIG. 2D illustrates an embodiment of a process for forming a trilayer photoresist stack on a substrate.

FIG. 2B illustrates the first layer 204 of the trilayer resist structure. The first layer 204 may be an OPL or organic layer for example. In various embodiments, the first layer 204 is a carbon hard mask (CHM) layer, an organic dielectric layer (ODL), an amorphous silicon layer, and/or an oxide layer. In an embodiment, the first layer 204 may be deposited on the intermediary layer 202 by the coating system 100 illustrated in FIG. 1, or a similar system. Next, a second layer 206 may be deposited on the first layer 204 as illustrated in FIG. 2C. For example, the second layer may be a SiARC layer which is spun onto the first layer 204 using a coating system 100. Finally, a third layer 208 may be deposited or coated onto the second layer 206 as shown in FIG. 2D. The third layer 208 may be a photosensitive patternable photoresist layer which is spun onto the surface of the second layer 206 using a coating system 100, such as the system of FIG. 1.

Once the trilayer structure of FIGS. 2A-2D is formed on the substrate 102, various exposure and developing processes may take place. For example, the third layer 208 may be exposed to light at Extreme Ultraviolet (EUV) or ultraviolet (UV) frequencies in a pattern defined by a pattern mask. In an embodiment, the third layer of photoresist may harden in certain areas as defined by the exposure mask, and remain unhardened in other areas. The exposure and developer tools are not illustrated, but one of ordinary skill will recognize a variety of available exposure and mask systems available for photolithography processes.

Figure 4:
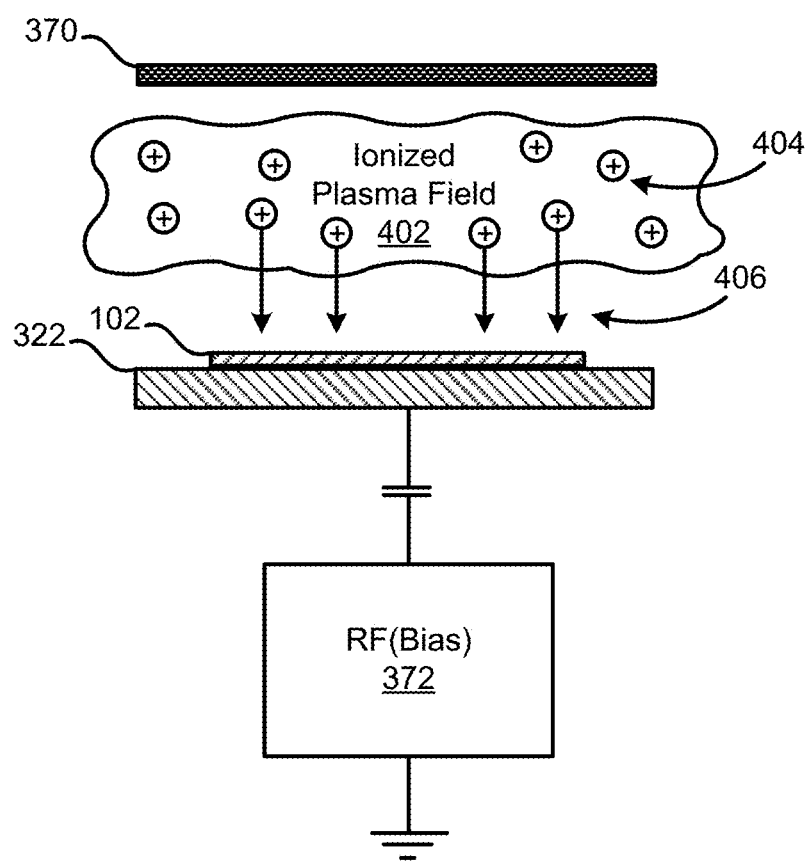
FIG. 4 illustrates an embodiment of a system for selective SiARC removal.
Figure 5:
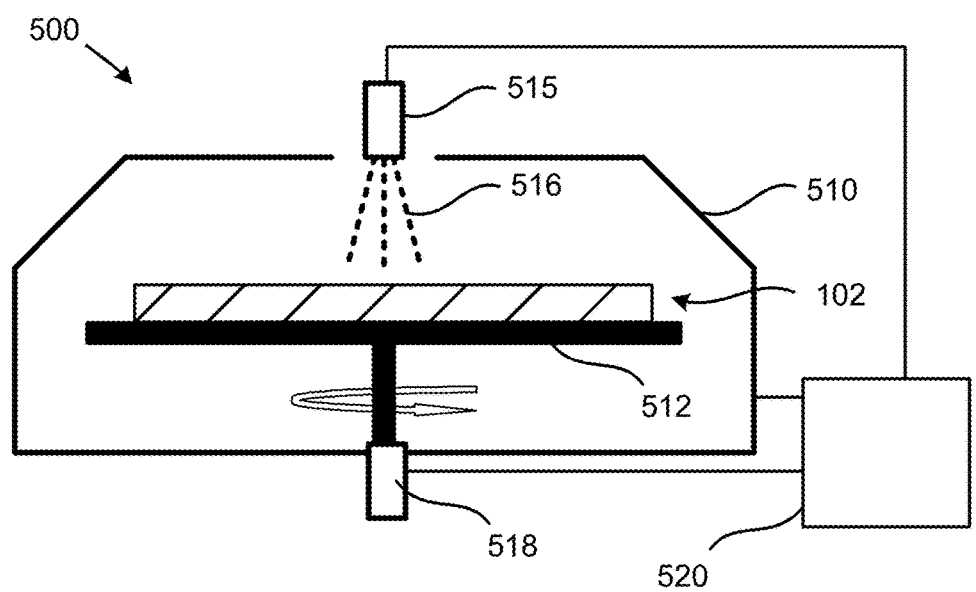
FIG. 5 illustrates an embodiment of a wet clean/etch system.

FIGS. 6A-6D and FIGS. 7A-7C illustrate examples of processes for etching the trilayer structure according to the pattern defined by the mask during the exposure process. In some embodiments, the trilayer material may be etched using a dry etch system, such as the plasma etch system of FIG. 3. In another embodiment, the trilayer material may be etched using wet etch chemistry dispensed by a wet etch system as illustrated in FIG. 5. In an embodiment, the second layer 206 may be etched using either the dry etch system of FIG. 3 or the wet etch system of FIG. 5 after nitridation of the second layer 206. An illustration of the nitridation process, which may be carried out by the system of FIG. 3, is illustrated in greater detail in FIG. 4.

Figure 3:
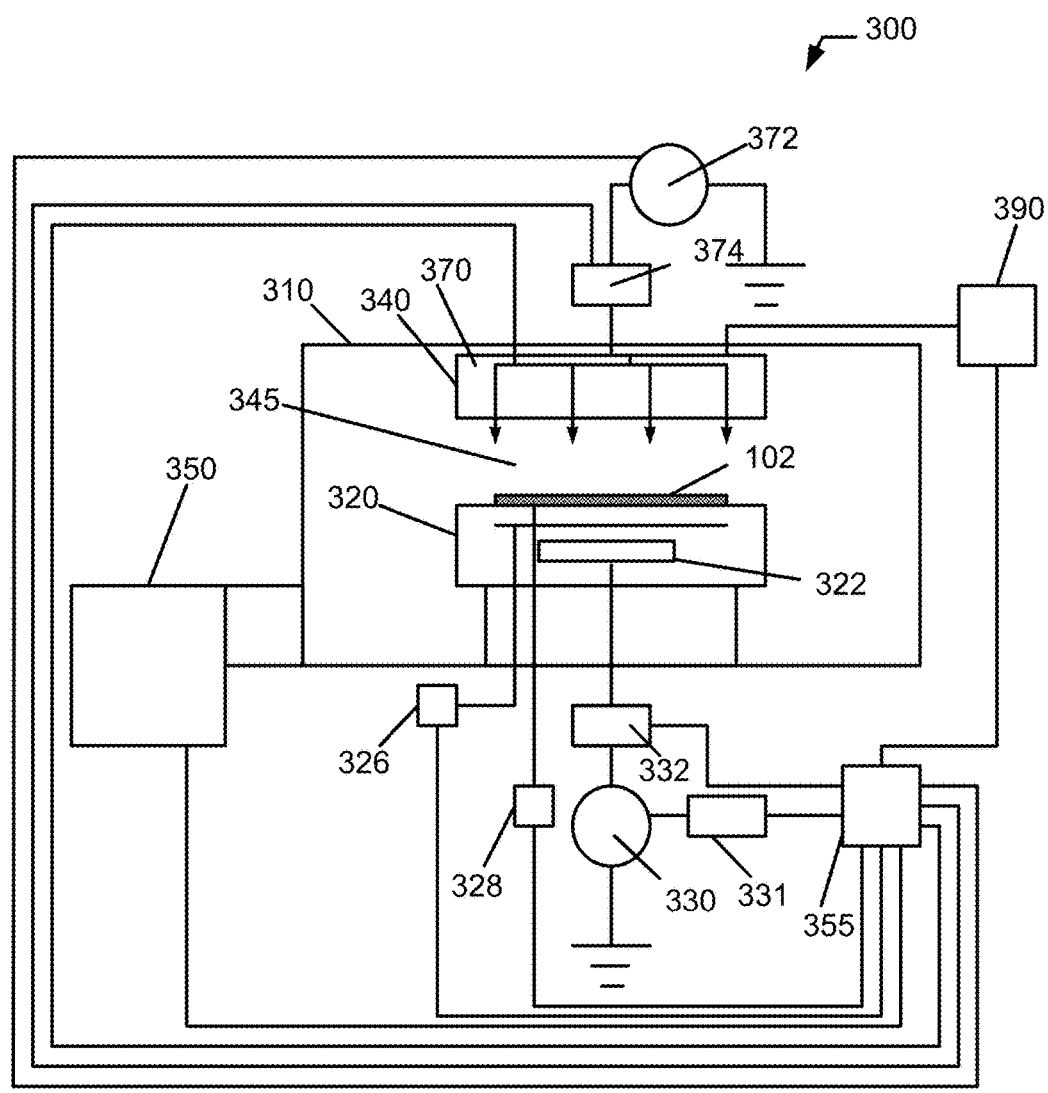
FIG. 3 illustrates an embodiment of a plasma etch system.

FIG. 3 is an embodiment of a system 300 for performing an etch and post heat treatment. In a further embodiment, as described with reference to FIG. 4, the system 300 may be further configured for nitridation of the SiARC layer. An etch and post heat treatment system 300 configured to perform the above identified process conditions is depicted in FIG. 3 comprising a processing chamber 310, substrate holder 320, upon which a substrate 102 to be processed is affixed, and vacuum pumping system 350. Substrate 102 can be a semiconductor substrate, a wafer, a flat panel display, or a liquid crystal display. Processing chamber 310 can be configured to facilitate etching the processing region 345 in the vicinity of a surface of substrate 102. An ionizable gas or mixture of process gases is introduced from the gas supply 390 via a gas distribution system 340. For a given flow of process gas, the process pressure is adjusted using the vacuum pumping system 350. In an embodiment, at least a component of the process gas contains nitrogen, which may be ionized in the plasma field generated by the system. The nitrogen ions may bombard the surface of the second layer 206 on the substrate 102, as illustrated in FIG. 4, to facilitate removal of the second layer 206. Further, the processing can aid the removal of material from the exposed surfaces of substrate 102, such as any of the first layer 204 through the third layer 208. The etch processing system 300 can be configured to process substrates of any desired size, such as 200 mm substrates, 300 mm substrates, or larger.

Substrate 102 can be affixed to the substrate holder 320 via a clamping system (not shown), such as a mechanical clamping system or an electrical clamping system (e.g., an electrostatic clamping system). Furthermore, substrate holder 320 can include a heating system (not shown) or a cooling system (not shown) that is configured to adjust and/or control the temperature of substrate holder 320 and substrate 102. The heating system or cooling system may comprise a re-circulating flow of heat transfer fluid that receives heat from substrate holder 320 and transfers heat to a heat exchanger system (not shown) when cooling, or transfers heat from the heat exchanger system to substrate holder 320 when heating. In other embodiments, heating/cooling elements, such as resistive heating elements, or thermo-electric heaters/coolers can be included in the substrate holder 320, as well as the chamber wall of the processing chamber 310 and any other component within the processing system 300.

Additionally, a heat transfer gas can be delivered to the backside of substrate 102 via a backside gas supply system 326 in order to improve the gas-gap thermal conductance between substrate 102 and substrate holder 320. Such a system can be utilized when temperature control of the substrate is required at elevated or reduced temperatures. For example, the backside gas supply system can comprise a two-zone gas distribution system, wherein the gas-gap pressure can be independently varied between the center and the edge of substrate 102.

In the embodiment shown in FIG. 3, substrate holder 320 can comprise an electrode 322 through which RF power is coupled to the processing region 345. For example, substrate holder 320 can be electrically biased at a RF voltage via the transmission of RF power from a RF generator 330 through an optional impedance match network 332 to substrate holder 320. The RF electrical bias can serve to heat electrons to form and maintain plasma. In this configuration, the system 300 can operate as a reactive ion etch (RIE) reactor, wherein the chamber and an upper gas injection electrode serve as ground surfaces. Additionally, the RF electrical bias may be used to direct nitrogen ions into the second layer 206. A typical frequency for the RF bias can range from about 0.1 MHz to about 80 MHz. RF systems for plasma processing are well known to those skilled in the art.

Furthermore, the electrical bias of electrode 322 at a RF voltage may be pulsed using pulsed bias signal controller 331. The RF power output from the RF generator 330 may be pulsed between an off-state and an on-state, for example. Alternately, RF power is applied to the substrate holder electrode at multiple frequencies. Furthermore, impedance match network 332 can improve the transfer of RF power to plasma in plasma processing chamber 310 by reducing the reflected power. Match network topologies (e.g. L-type, π-type, T-type, etc.) and automatic control methods are well known to those skilled in the art.

Gas distribution system 340 may comprise a showerhead design for introducing a mixture of process gases. Alternatively, gas distribution system 340 may comprise a multi-zone showerhead design for introducing a mixture of process gases, including nitrogen or nitrogen-containing gasses such as SiONx, where x is a number greater than 0, and adjusting the distribution of the mixture of process gases above substrate 102. For example, the multi-zone showerhead design may be configured to adjust the process gas flow or composition to a substantially peripheral region above substrate 102 relative to the amount of process gas flow or composition to a substantially central region above substrate 102. In such an embodiment, gases may be dispensed in a suitable combination to form an $H_2N_2$ plasma within the chamber 310.

Vacuum pumping system 350 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 310.

As mentioned above, the controller 355 can comprise a microprocessor, memory, and a digital I/O port capable of generating control voltages sufficient to communicate and activate inputs to processing system 300 as well as monitor outputs from plasma processing system 300. Moreover, controller 355 can be coupled to and can exchange information with RF generator 330, pulsed bias signal controller 331, impedance match network 332, the gas distribution system 340, vacuum pumping system 350, as well as the substrate heating/cooling system (not shown), the backside gas supply system 326, and/or the electrostatic clamping system 328. For example, a program stored in the memory can be utilized to activate the inputs to the aforementioned components of processing system 300 according to a process recipe in order to perform a plasma assisted process, such as a plasma etch process or a post heating treatment process, on substrate 102.

In addition, the processing system 300 can further comprise an upper electrode 370 to which RF power can be coupled from RF generator 372 through optional impedance match network 374. A frequency for the application of RF power to the upper electrode can range from about 0.1 MHz to about 200 MHz, in one embodiment. Alternatively, the present embodiments may be used in connection with Inductively Coupled Plasma (ICP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, controller 355 is coupled to RF generator 372 and impedance match network 374 in order to control the application of RF power to upper electrode 370. The design and implementation of an upper electrode is well known to those skilled in the art. The upper electrode 370 and the gas distribution system 340 can be designed within the same chamber assembly, as shown. Alternatively, upper electrode 370 may comprise a multi-zone electrode design for adjusting the RF power distribution coupled to plasma above substrate 102. For example, the upper electrode 370 may be segmented into a center electrode and an edge electrode.

Depending on the applications, additional devices such as sensors or metrology devices can be coupled to the processing chamber 310 and to the controller 355 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

As described above, with relation to FIG. 3, the plasma system 300 may include an upper electrode 370 and a lower electrode 322, each of which may be coupled to a power supply, such as RF generator 372. The bias applied to the electrode(s) 322, 370 generates an electric field between the electrodes 322, 370 where an ionized plasma field 402 in FIG. 4 is generated. In an embodiment, referring to FIG. 4, the ions 404 in the ionized plasma field 402 may contain nitrogen ions. Alternatively, the ionized plasma field 402 may contain oxygen or hydrogen ions. In one embodiment, the plasma field 402 is an $H_2N_2$ plasma field. The ions 404 may be directed at the surface of the substrate 102 by the electric field generated by the bias of the electrode 322. In an embodiment, the ions 404 may bombard the second layer 206 at an energy gained in the plasma sheath 406. In an embodiment, the fluence of implanted nitrogen ions may be variable, depending upon the ion flux and length of implantation at the plasma sheath 406. The concentration of ions in the ionized plasma field 402 may be controlled by the source power and the gas composition. The energy may be controlled by the biasing potential. In an embodiment, the ion energy may define the penetration depth and ion distribution inside the second layer 206. The ion energy may be a function of bias power and pressure in the process chamber 310. In an embodiment, the organic layer 204 may be etched and the second layer 206 may be treated with the nitrogen ions simultaneously. In other embodiments, the nitridation of the second layer 206 may be conducted in a separate process.

In various embodiments, the ionized plasma field 402 may be $NF_3$ or $H_2$ plasmas for removal of the modified SiARC. In another embodiment, an HF gas may be used for the ionized plasma field 402. One of ordinary skill may recognize a variety of useful alternative etch gasses, or modification gasses, that can be suitably used according to the present embodiments.

In an embodiment, the modification process may be tuned or optimized such that ion implantation depth is sufficient to remove all, or nearly all, of the SiARC layer, without damaging underlying layers. In such an embodiment, the optimized process may result in less residue after the integration process is complete. The nitridation process may be optimized by adjusting various aspects of the process. For example, the nitrogen gas concentration may be adjusted to modify the concentration of nitrogen ions available for implantation. Alternatively, the plasma density may be modified. Additionally, the etch time may be adjusted. Other process parameters may be adjusted, including for example, the process temperature, the process pressure or the bias power.

In one embodiment, the operating variables may include plasma density, plasma ion energy, feed gas flow rates, etching time, etching rate, process pressure, process temperature, and bias power. One example includes controlling the feed gas flow rates for any one of HF, $H_2$ or $NF_3$ feed gases. Accordingly, the examples of target integration objectives include: percent removal of residue, percent removal of SiARC, etch selectivity of SiARC to oxide, extent of damage to devices on the structures of the substrate, and/or extent of damage to the OPL, ODL, and/or the oxide layers. In one example, a target integration objective is to maintain a SiARC to oxide selectivity in the range of 5:1 or higher.

The criteria of interest for the optimization is the tradeoff between percent removal of SiARC residue and the extent of damage to the device-level structures on the substrate 102, and or the extent of damage to the OPL or organic layer 204. Process pressures may be in the range of 5 mT to 300 mT and etching time may be in the range of 5 to 600 seconds. Process temperatures may be in the range of −10 degrees to +80 degrees Celsius. The feed gas flow rate may be in a range of 10 sccm to 2000 sccm for the $N_2/H_2$ gasses or gas mixtures. For example, in one embodiment the $N_2$ flow rate may be 200 sccm to 400 sccm. Similarly, the $H_2$ flow rate may be in the range of 200 sccm to 400 sccm in particular embodiments. In such embodiments, the pressure may be 20 mT to 100 mT. The source power may be in the range of 100 W and 3000 W. In an embodiment, bias power is in a range of 100 W and 3000 W. In another embodiment, the ion energy is in the range of 100 to 2000 eV. One of ordinary skill will recognize other suitable ranges, depending upon equipment parameters and process needs. In an embodiment, these variables may be controlled by the controller in order to meet layer or region removal process objectives, also referred to as integration objectives.

After nitridation of the second layer 206, the second layer 206 may be removed either by dry etch processes in the system of FIG. 3 or by wet clean/etch in, for example, a weak hydrofluoric acid (HF) dilution (e.g., HF/HCl), or other less aggressive etch recipes known to those of skill in the art. An example of a system 500 for wet clean/etch is illustrated in FIG. 5. In such an embodiment, the system 500 includes a wet etch chamber 510 to contain the wet etch chemicals, which may include harsh acids in some embodiments.

In an embodiment, the substrate 102 is placed within the chamber 510 on a rotating substrate holder 512, such as a plate or chuck. The rotating substrate holder 512 may be rotated at various rates of rotation by a motorized base 518. In an embodiment, the motorized base 518 may be controlled by a controller 520. Additionally, the controller 520 may control a rate at which an etch solution dispenser 515, such as a nozzle or showerhead, may dispense a wet etch chemical 516, such as the HF dilution. The etch solution may be drawn across a surface of the substrate 102 by centrifugal force, thereby removing particles of material from the substrate surface. The etch rate can be controlled by the controller 520, by adjusting the rate of rotation, the rate of dispensing, or both.

Figure 6A:
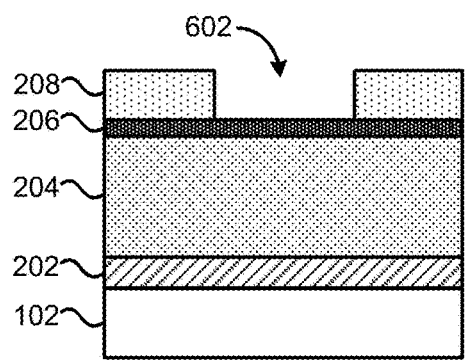
FIG. 6A illustrates an embodiment of a process for selective SiARC removal.
Figure 6B:
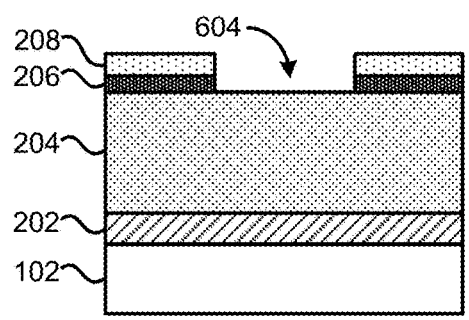
FIG. 6B illustrates an embodiment of a process for selective SiARC removal.
Figure 6C:
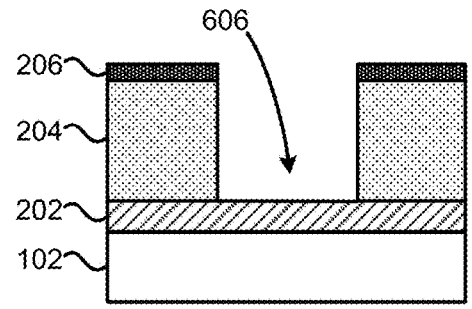
FIG. 6C illustrates an embodiment of a process for selective SiARC removal.
Figure 6D:
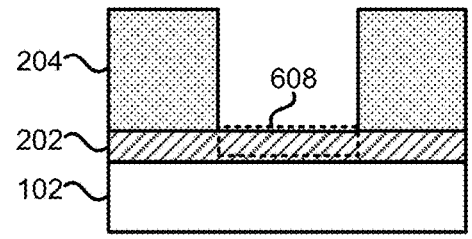
FIG. 6D illustrates an embodiment of a process for selective SiARC removal.

An example of an etch process is illustrated in FIGS. 6A-6D. After patterned exposure of the substrate 102 and layers 204-208 disposed thereon, portions of the trilayer structure may be etched away, using either the dry etch system of FIG. 3 or the wet etch system of FIG. 5. For example, features having a Critical Dimension (CD) may be etched into the trilayer structure. In the step of FIG. 6A, a first feature 602 having a first depth may be formed in the third layer 208. In an embodiment, the third layer may be etched by either a wet etch process or a dry etch process, as described above. At the step shown in FIG. 6B, a second feature 604 having a second depth may be etched into the second layer 206. At the step shown in FIG. 6C, a third feature 606 having a third depth may be etched into the first layer 204. Additionally, the second layer 206 may undergo the nitridation process illustrated in FIG. 4. In such an embodiment, the second layer 206 may be a SiARC layer, which is bombarded with nitrogen ions. At FIG. 6D, the second layer 206 is completely removed, having previously undergone the nitridation process. In an embodiment, the step of FIG. 6D is achieved by a less aggressive dry etch process. In another embodiment, the step of FIG. 6D is achieved by a weak wet etch process, such as with a weak HF dilution. Regardless of the embodiment selected, the second layer, which may comprise a SiARC layer, is removed with a process that is highly selective to the device level structure in the region 608 of the intermediary layer 202.

Figure 7A:
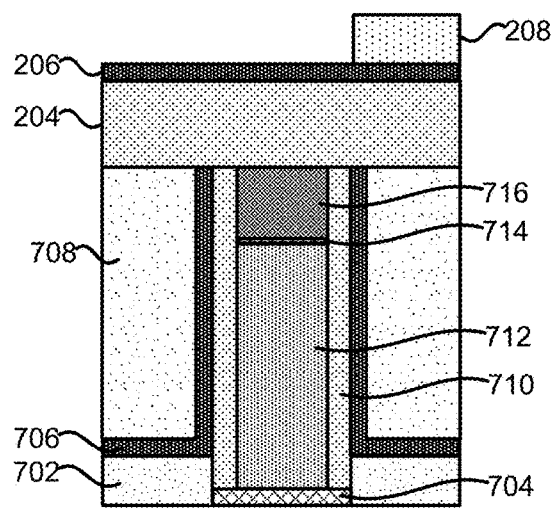
FIG. 7A illustrates an example of a process for selective SiARC removal.
Figure 7B:
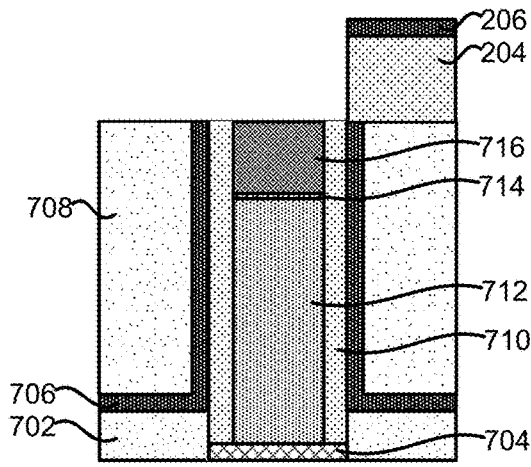
FIG. 7B illustrates an example of a process for selective SiARC removal.
Figure 7C:
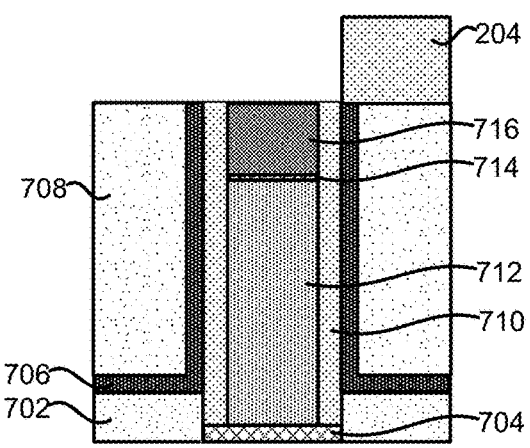
FIG. 7C illustrates an example of a process for selective SiARC removal.

FIGS. 7A-7C illustrate an example of side views of a structure on which the methods described above were tested with favorable results. FIG. 7A illustrates the fin field effect transistor (FINFET) structure tested. The structure was formed on a substrate 102 (not shown), and included an epitaxial layer 702, a gate oxide layer 704, a silicon nitride (SiN) intermediary layer 706 separating a flowable oxide (FOX) 708 layer from a gate structure having an amorphous silicon (aSi) layer 712, a thin high-k layer 714, and a SiN cap 716. The gate structure may be spaced apart from the FOX layer 708 by a SiN spacer 710.

In an embodiment, a trilayer structure is formed adjacent the FINFET structure, having a first layer 204, a second layer 206, and the third layer 208. The third layer 208 may be partially removed by the patterning and removal processes described above. In an embodiment, a portion of the second layer 206 and the first layer 204 may be removed using an etch process. The portion remaining, as shown in FIG. 7B may be disposed beneath the portion of the third layer 208 shown in FIG. 7A. In an embodiment, the second layer 206, being in some embodiments an SiARC layer, may undergo a nitridation process. In an embodiment, the nitridation process is performed at substantially the same time as a plasma etch. In FIG. 7C, the second layer 206 is removed, leaving the FINFET structure and the remaining portion of the first layer 204 substantially undamaged. The results of this test demonstrated that the SiARC removal processes described herein are sufficient for commercial use.

Figure 8:
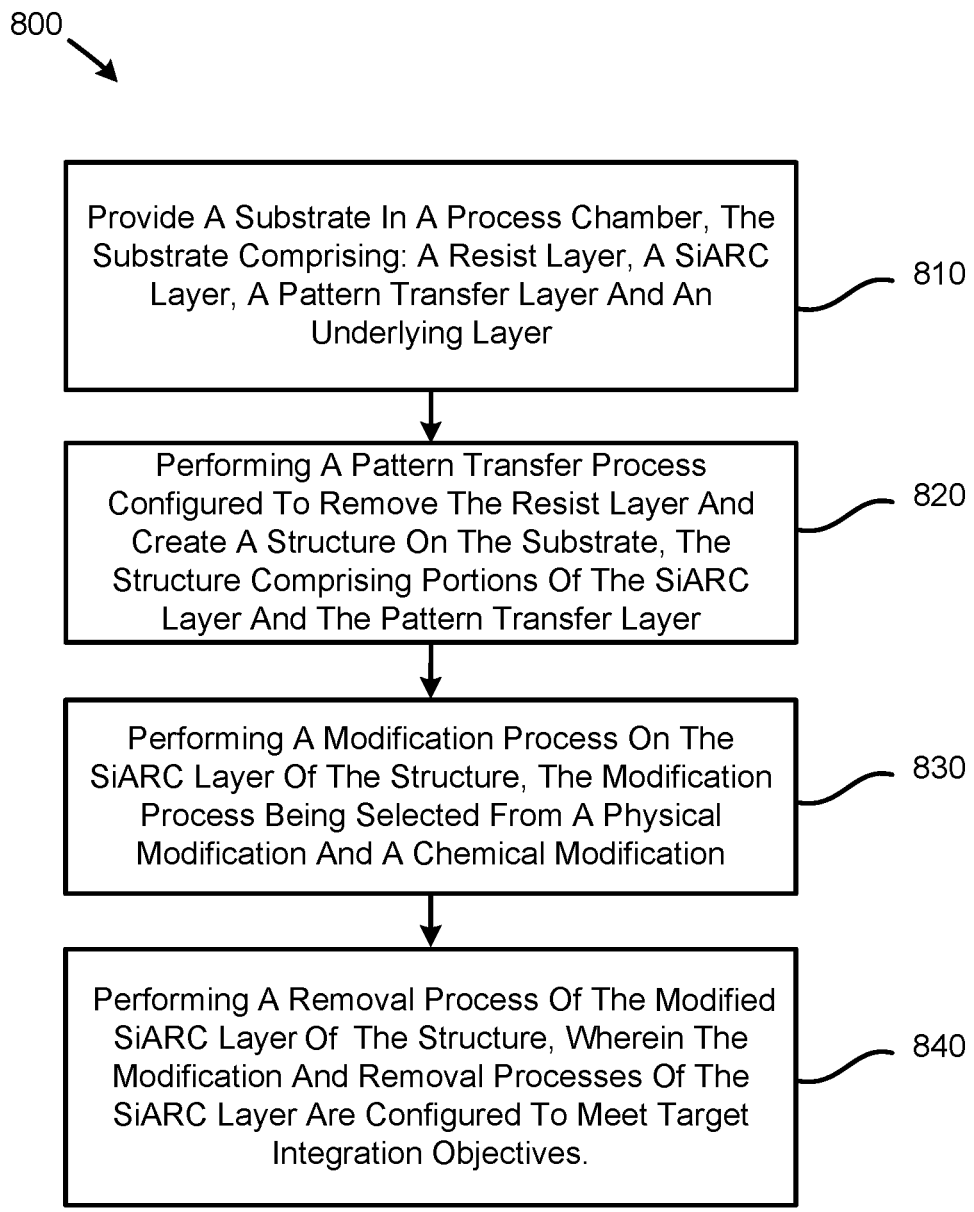
FIG. 8 illustrates flowchart diagram of an embodiment of a method for selective SiARC removal.

FIG. 8 illustrates an embodiment of a method 800 for SiARC removal. In one embodiment, the method 800 includes providing a substrate in a process chamber, the substrate comprising: a resist layer, a SiARC layer, a pattern transfer layer and an underlying layer as shown at block 810. Additionally, the method 800 in FIG. 8 may include performing a pattern transfer process configured to remove the resist layer and create a structure on the substrate, the structure comprising portions of the SiARC layer and the pattern transfer layer as shown in block 820. The method 800 also includes performing a modification process on the SiARC layer of the structure, the modification process being selected from a physical or a chemical modification at block 830. Additionally, the method 800 may include performing a removal process of the modified SiARC layer from the structure as shown at block 840. In such embodiments, the selective etch process exhibits high sensitivity to device level structures in the substrate and the integration process is configured to meet target integration objectives as described with relation to FIGS. 6A-6D.

Figure 9:
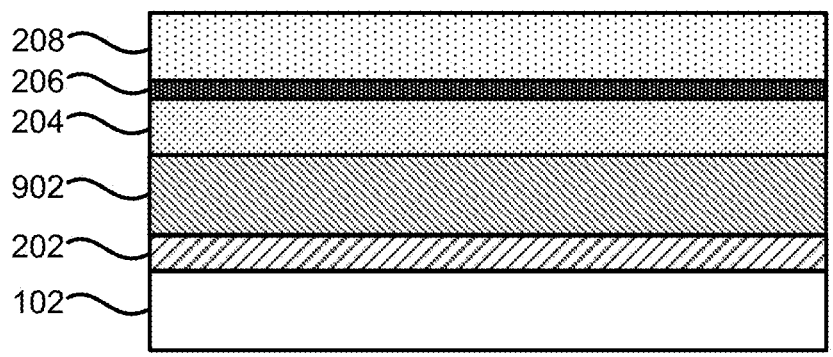
FIG. 9 is a cross-section view illustrating one embodiment of a trilayer photoresist stack and an underlying layer.

FIG. 9 is a cross-section view illustrating one embodiment of a trilayer photoresist stack and an underlying layer in a substrate. In addition to the layers described above with relation to FIGS. 1 and 2, this embodiment may include an additional amorphous layer 902, such as amorphous silicon (aSi). An amorphous layer 902 may be useful in fabrication of solar cells or liquid crystal displays (LCDs). Although the embodiments of FIGS. 11A-11D are described with relation to the structure of FIG. 9, one of ordinary skill will recognize that it is not a requirement to include the amorphous layer 902. More or fewer layers may be included, comprising a variety of layer materials.

Figure 10:
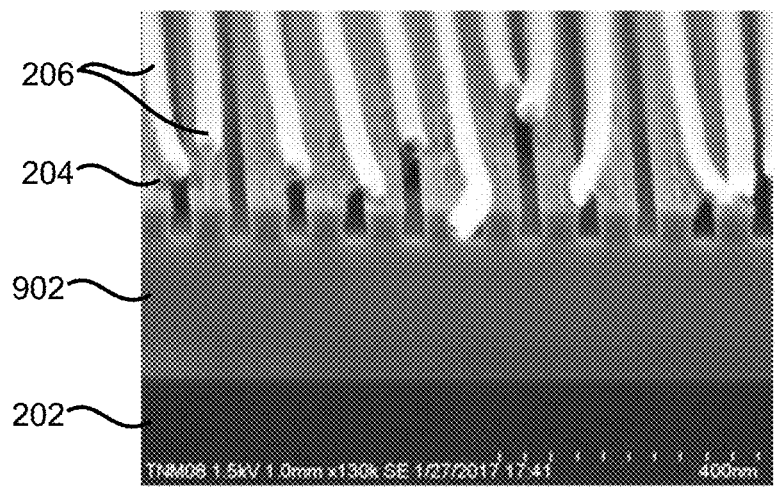
FIG. 10 illustrates an example of incomplete removal of a SiARC layer.

FIG. 10 illustrates an example of incomplete removal of a SiARC layer. Incomplete removal of the SiARC layer is a common issue in device manufacturing because of the low level of selectivity between standard SiARC layers and underlying materials, such as oxides. Incomplete removal can lead to manufacturing defects that degrade the device, or render it unusable, thus creating waste and increasing costs.

In the embodiment of FIG. 10, the second layer 206, which may be SiARC, is not completely removed. Some portions of the first layer 204, which may be an organic layer, also remains post etch. Thus, the intermediary layer 902 is not fully exposed by the etch. In the embodiment of FIG. 10, a portion of the oxide layer 202 is also shown.

Figure 11A:
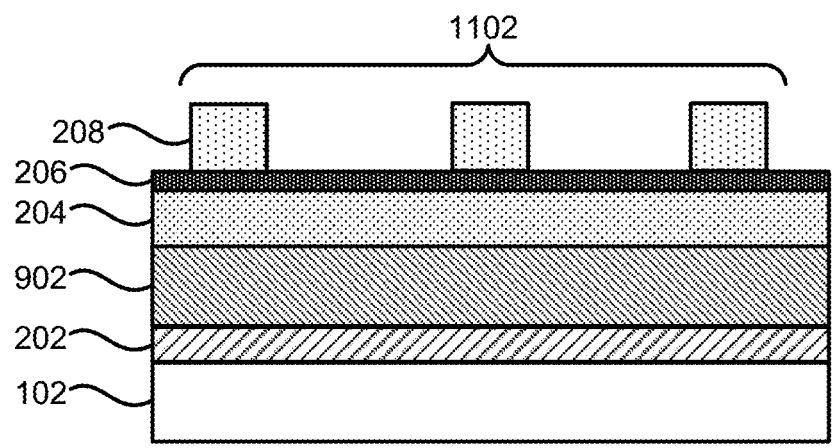
FIG. 11A illustrates an example of a process for selective SiARC removal.
Figure 11B:
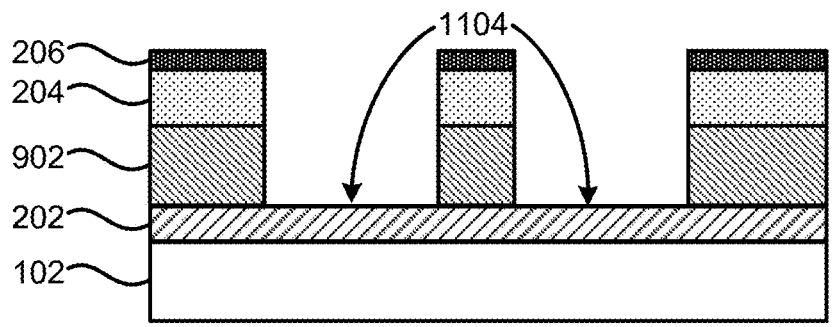
FIG. 11B illustrates an example of a process for selective SiARC removal.

FIG. 11A through 11D illustrate side views of a substrate in a set of processes for selective SiARC removal. In FIG. 11A, in an embodiment, the third layer 208, which may be a resist layer, is formed into a patterned mask 1102. Exposed regions of the second layer 206 and the first layer 204 may be removed. Additionally, portions of the amorphous layer 902 may be removed. The removed portions may form trenches or other physical features 1104 in the layers, as shown in FIG. 11B. In such an embodiment, the first layer 204 may be an organic layer, the second layer 206 may be a SiARC layer and the third layer 208 may be a resist layer.

Figure 11C:
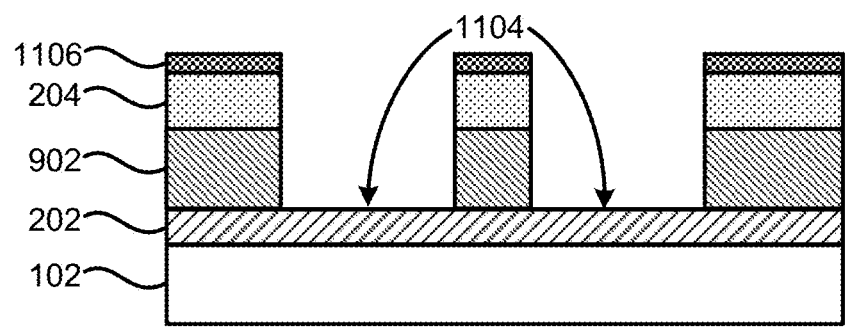
FIG. 11C illustrates an example of a process for selective SiARC removal.
Figure 11D:
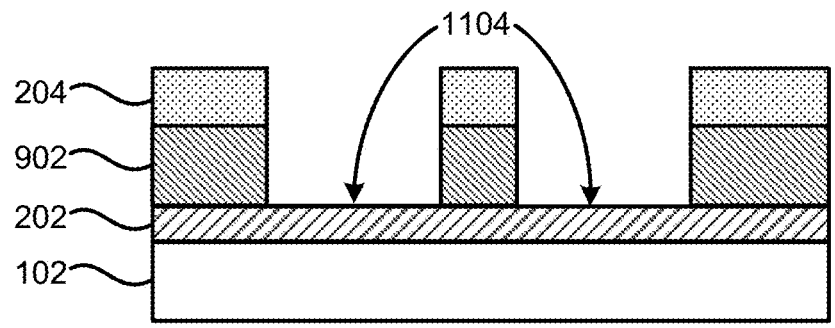
FIG. 11D illustrates an example of a process for selective SiARC removal.

In the step illustrated in FIG. 11C, the second layer 206, which may be a SiARC layer in some embodiments, may undergo a modification process, thereby becoming a modified layer 1106. The modification process may include one or more of the nitridation or carbon stripping processes described herein. The modified layer 1106 may then be stripped by a subsequent etch process as illustrated in FIG. 11D. In one embodiment, the subsequent etch process is a wet etch. Alternatively, the subsequent etch process may be a dry etch process that is selective to the material of one of the intermediary layer 202 or the underlying layer 204.

Figure 12:
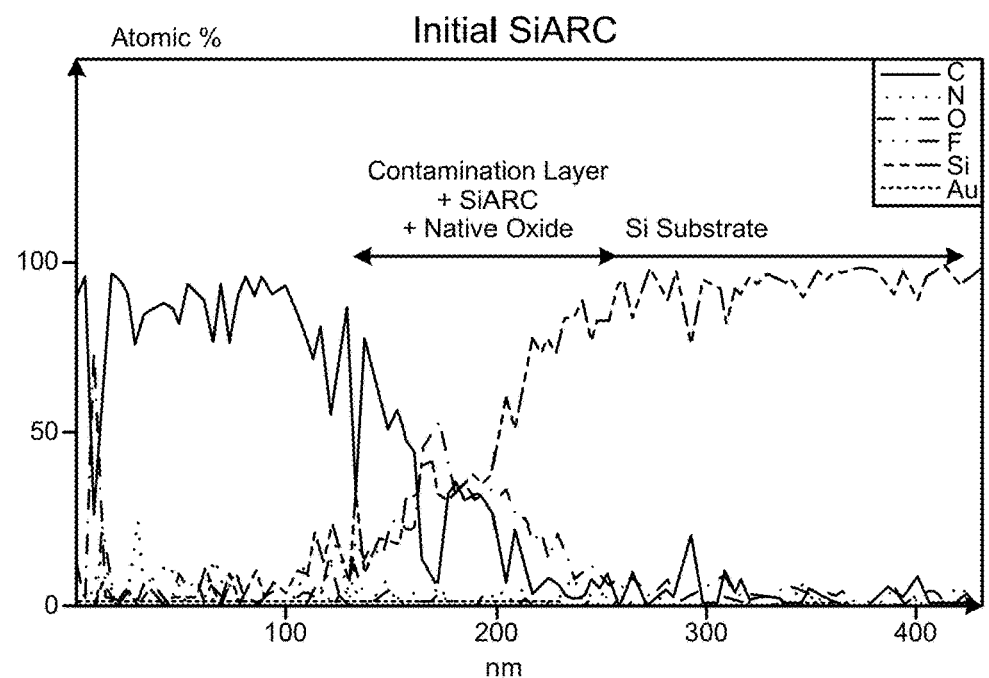
FIG. 12 illustrates the atomic composition of SiARC prior to oxygen plasma treatment.
Figure 13:
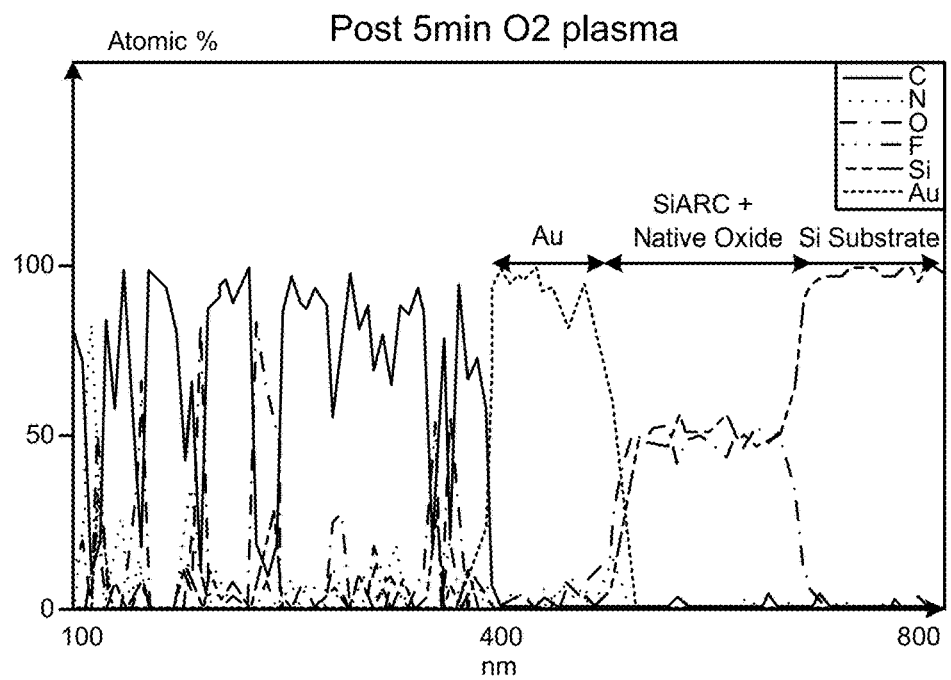
FIG. 13 illustrates the atomic composition of SiARC after oxygen plasma treatment.

FIGS. 12 and 13 illustrate the effects of $O_2$ plasma treatment after exposure for 5 minutes on the presence of various SiARC layer contaminants, including Carbon, Nitrogen, Oxygen, etc. FIG. 12 shows the present composition of a multilayer structure according to depth in nanometers. The various layers of the structure are labeled with the arrows. The primary area of interest in the present embodiments is the SiARC region. As can be seen in FIG. 12, the untreated SiARC layer includes up to 20% Carbon. As illustrated in FIG. 13, the plasma treatment affects a significant reduction, nearly down to 0%, in the presence of Carbon and other contaminants, thereby producing a porous SiARC layer.

Figure 14:
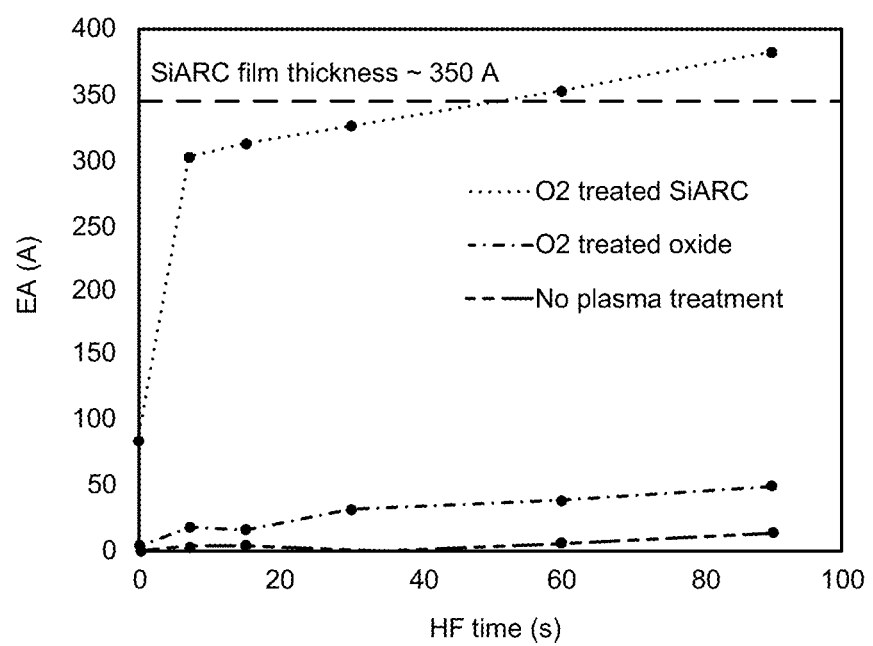
FIG. 14 illustrates experimental results of one embodiment of a SiARC removal process.

FIG. 14 illustrates experimental results of one embodiment of a SiARC removal process. Three structures were submitted to a wet etch bath comprising HF for various time periods. The first structure represented by a dotted line is an $O_2$ treated SiARC layer, where the SiARC layer was modified to become porous by the $O_2$ plasma. The second structure represented by a dash-dot line was an $O_2$ treated oxide layer. The third structure represented by a mixed-dash line is a control that was not submitted to any modification process. As shown, a large deviation in the etch rate of the $O_2$ treated SiARC layer and the other structures was observed, demonstrating a high level of selectivity.

Figure 15:
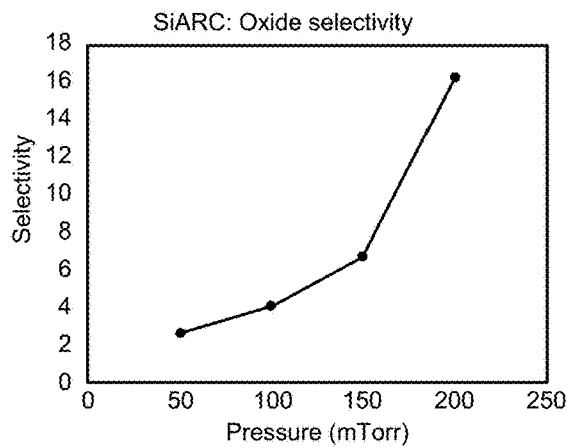
FIG. 15 illustrates experimental results of one embodiment of a SiARC removal process.
Figure 16:
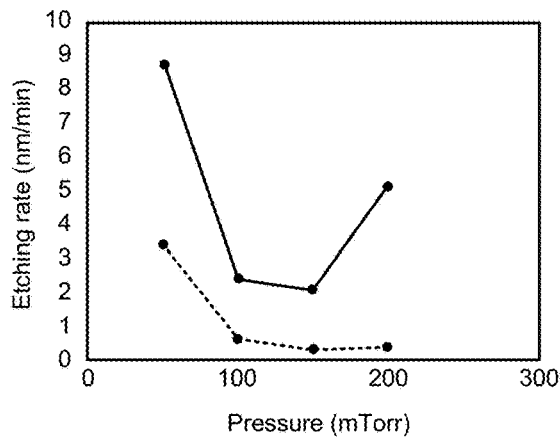
FIG. 16 illustrates experimental results of one embodiment of a SiARC removal process.
Figure 17:
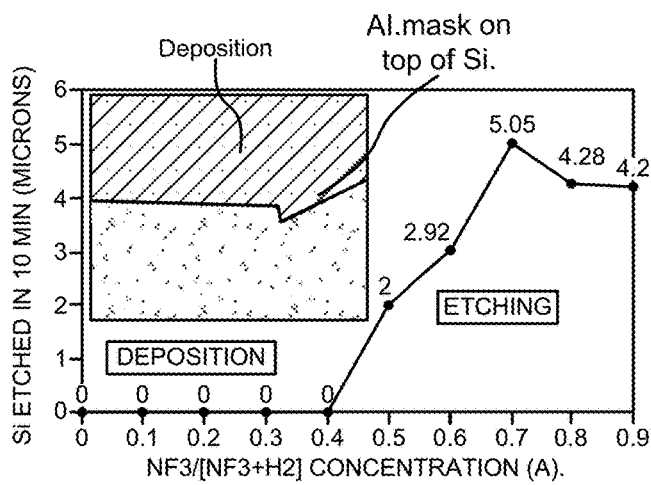
FIG. 17 illustrates experimental results of one embodiment of a SiARC removal process.

FIG. 15 illustrates an example of SiARC to oxide selectivity with respect to chamber gas pressure. As shown, pressures above 100 mTorr show strong selectivity, and pressures above 150 mTorr show extreme selectivity as compared with prior processes. Etching rates with respect to chamber gas pressure are shown in FIG. 16. Etch rates with respect to an example of etch gas concentration are shown in FIG. 17.

Figure 18:
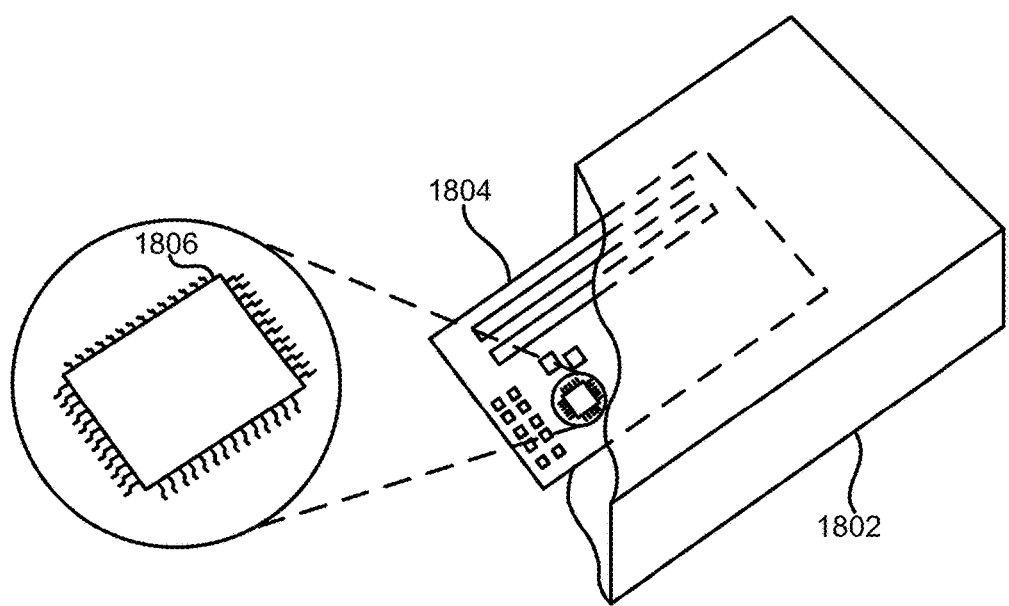
FIG. 18 illustrates an embodiment of a device having a component manufactured according to a method for selective SiARC removal.

The embodiments of the processes and methods described herein may be used in commercial processes for manufacturing semiconductor-based products for inclusion in commercial products. For example, FIG. 18 illustrates an electrical device 1802 comprising a printed circuit board (PCB). The electrical device 1802 may be one of a number of commercially available products, including for example, computers, computer monitors, televisions, audio amplifiers, cameras, smartphones and personal data assistants, tablet computing devices, smart watches, application-specific processing equipment, sensor devices, medical devices, etc. One of ordinary skill will recognize that devices manufactured according to the present embodiments are not limited to any particular field.

The electrical device 1802 may include one or more PCBs 1804, the PCBs 1804 comprising one or more semiconductor-based electrical components, such as chip package 1806. Chip package 1806 may include a segmented chip of a wafer having one or more features, such as the FINFET device of FIGS. 7A-7C disposed thereon. The chip may comprise, for example, a silicon substrate 102. The chip may be packaged in a durable package for protection of the features disposed thereon. The chip package 1806 may further include one or more contact pins configured to provide external access to certain contact points on the chip.

Advantageously, the size and density of the features disposed on the chip in chip package 1806 may be small relative to devices manufactured with other techniques, because use of the trilayer stack allows for high resolution patterning of the semiconductor device. Further, the described methods allow for easy removal of the SiARC layers used for patterning, relative to previous removal methods.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for an integration process of selectively removing a silicon-containing antireflective coating (SiARC) in a substrate, the method comprising:
   providing a substrate in a process chamber, the substrate comprising:
      a resist layer, a SiARC layer, a pattern transfer layer, and an underlying layer;
   performing a pattern transfer process configured to remove the resist layer and create a structure on the substrate, the structure comprising portions of the SiARC layer and the pattern transfer layer;
   performing a nitridation modification process on the SiARC layer of the structure, the nitridation modification process using a plasma of nitrogen ions and bombarding the SiARC layer to implant the nitrogen ions therein to an implantation depth, converting the SiARC layer into a nitrided SiARC layer having an increased nitrogen content; and
   performing a removal process of the nitrided SiARC layer of the structure, wherein the increased nitrogen content increases percent removal of the SiARC layer and increases etch selectivity of the SiARC layer relative to the pattern transfer layer and/or the underlying layer.

2. The method of claim 1 wherein the pattern transfer layer comprises a carbon hard mask (CHM) layer, an organic dielectric layer (ODL), an amorphous silicon layer, and/or an oxide layer.

3. The method of claim 1 wherein the nitridation modification process further uses oxygen ions or hydrogen ions in the ionized plasma field.

4. The method of claim 1 wherein the removal process of the nitrided SiARC layer utilizes a dry etch process step and a wet etch process step.

5. The method of claim 4 wherein the dry etch process step utilizes an $NF_3$ or $H_2$ plasma.

6. The method of claim 4 wherein the wet etch process step utilizes a dilute HF or HCl.

7. The method of claim 1 wherein the removal process of the nitrided SiARC layer utilizes a dry etch process step and a second dry etch process step.

8. The method of claim 7 wherein the second dry etch process step utilizes an HF gas.

9. The method of claim 1 further comprising selecting and controlling one or more operating variables of the integration process in order to meet target integration objectives including the implantation depth being sufficient to remove substantially all of the SiARC layer.

10. The method of claim 9 wherein the one or more operating variables include plasma density, plasma ion energy, feed gas flow rates for gases used in the nitridation modification process and/or the removal process, etching time, etching rate, nitridation modification process pressure, nitridation modification process temperature, or bias power.

11. The method of claim 10 wherein target integration objectives further include percent removal of residue, etch selectivity of the SiARC layer relative to the pattern transfer layer, etch selectivity of the SiARC layer relative to the underlying layer, extent of damage to the underlying layer, and/or extent of damage to the pattern transfer layer.

12. The method of claim 11 wherein two or more of the operating variables of the nitridation modification and removal processes are controlled using a controller in order to meet the target integration objectives.

13. The method of claim 12 wherein the target integration objectives include the etch selectivity of the SiARC layer relative to the pattern transfer layer and/or the underlying layer in a range of 5:1 or higher.

14. The method of claim 13 wherein the nitridation modification process pressure is controlled in a range from 150 to 300 mTorr.

15. A method for an integration process of selectively removing a silicon-containing antireflective coating (SiARC) in a substrate, the method comprising:
   providing a substrate in a process chamber, the substrate comprising a resist layer, a SiARC layer, a pattern transfer layer, and an underlying layer;
   performing a pattern transfer process configured to remove the resist layer and create a structure on the substrate, the structure comprising portions of the SiARC layer and the pattern transfer layer;
   concurrently with performing the pattern transfer process, nitriding the SiARC layer of the structure using a plasma of $N_2$ and $H_2$ to implant nitrogen ions to an implantation depth; and
   removing the nitrided SiARC layer of the structure, wherein the implantation depth is sufficient to achieve substantially complete removal of the SiARC layer with an etch selectivity of the SiARC layer relative to the pattern transfer layer and/or the underlying layer of at least 5:1.

16. The method of claim 15 wherein removing the nitrided SiARC layer includes a dry etch process with $NF_3$ or $H_2$ plasma.

17. The method of claim 15 wherein removing the nitrided SiARC layer includes a wet etch process with dilute HF or HCl.

18. The method of claim 15 further comprising selecting and controlling one or more operating variables of the integration process in order to meet target integration objectives including the implantation depth being sufficient to achieve substantially complete removal of the SiARC layer and the etch selectivity of at least 5:1.

19. The method of claim 18 wherein the one or more operating variables include plasma density, plasma ion energy, $N_2$ and $H_2$ flow rates, etching time, etching rate, process pressure during nitriding, process temperature during nitriding, or bias power.

* * * * *